(12) United States Patent
Martins

(10) Patent No.: US 11,920,765 B2
(45) Date of Patent: Mar. 5, 2024

(54) ELECTRONIC COVER

(71) Applicant: ABB Schweiz AG, Baden (CH)

(72) Inventor: Fabrice Martins, Saint Genis Laval (FR)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 17/846,252

(22) Filed: Jun. 22, 2022

(65) Prior Publication Data

US 2022/0412540 A1 Dec. 29, 2022

(30) Foreign Application Priority Data

Jun. 24, 2021 (EP) .................................... 21181429

(51) Int. Cl.
*F21V 19/00* (2006.01)
*F21V 23/00* (2015.01)
*H05K 1/09* (2006.01)
*H05K 1/14* (2006.01)
*H05K 1/18* (2006.01)
*F21Y 115/10* (2016.01)

(52) U.S. Cl.
CPC ........ *F21V 19/0015* (2013.01); *F21V 23/009* (2013.01); *H05K 1/092* (2013.01); *H05K 1/14* (2013.01); *H05K 1/181* (2013.01); *F21Y 2115/10* (2016.08); *H05K 2201/10106* (2013.01)

(58) Field of Classification Search
CPC ... F21V 19/0015; F21V 23/009; H05K 1/092; H05K 1/14; H05K 1/181
See application file for complete search history.

(56) References Cited

U.S. PATENT DOCUMENTS

| | | | |
|---|---|---|---|
| 10,506,858 B2* | 12/2019 | Van Rooyen | F21V 23/0471 |
| 10,920,946 B2* | 2/2021 | Page | H01L 33/52 |
| 11,255,532 B1* | 2/2022 | Tong | F21V 23/0435 |
| 11,536,428 B2* | 12/2022 | Hou | F21V 23/0414 |
| 2018/0010752 A1 | 1/2018 | Rubia et al. | |
| 2020/0400296 A1* | 12/2020 | Rapisarda | F21L 4/00 |
| 2021/0239284 A1* | 8/2021 | Jeong | H05B 45/10 |

FOREIGN PATENT DOCUMENTS

| | | |
|---|---|---|
| DE | 102012223842 A1 | 6/2014 |
| EP | 2778518 A1 | 9/2014 |
| JP | 2010-118267 A | 5/2010 |
| WO | WO 2011/114263 A2 | 9/2011 |
| WO | WO 2019/029979 A1 | 2/2019 |
| WO | WO 2019/156973 A1 | 8/2019 |

OTHER PUBLICATIONS

European Patent Office, Extended European Search Report in European Application No. 21181429.8, 8 pp. (dated Nov. 29, 2021).
Canadian Intellectual Property Office, Office Action in Canadian Patent Application No. 3,164,839, 4 pp. (dated Sep. 29, 2023).

* cited by examiner

*Primary Examiner* — Christopher E Dunay
(74) *Attorney, Agent, or Firm* — Leydig, Voit & Mayer, Ltd.

(57) ABSTRACT

An electronic cover for an electrical lighting device includes a conducting electrical track structure for lighting components and control components.

12 Claims, 2 Drawing Sheets

ELECTRONIC COVER

CROSS-REFERENCE TO RELATED APPLICATIONS

This patent application claims priority to European Patent Application No. 21181429.8, filed on Jun. 24, 2021, which is incorporated herein in its entirety by reference.

FIELD OF THE DISCLOSURE

The present disclosure relates to an electronic cover for an electric lighting device, an electric lighting device, a method for manufacturing an electric lighting device, and use of an electronic cover in an electric lighting device.

BACKGROUND OF THE INVENTION

Existing electric lighting devices have a cover made of plastic, on which different elements are mounted such as a LED (light emitting diode) board, a lens, a test button, indicator LEDs and their electrical connections. All elements are part of sub-assemblies, made by different suppliers. After the elements have been collected from the suppliers, they are mounted together on the final assembly line, which is a cumbersome process, in particular also with respect to administration and coordination. Further, there are design constraints because of the shapes of the different elements of this sub-assembly.

BRIEF SUMMARY OF THE INVENTION

In one general aspect, the present disclosure describes an improved electric lighting device. The described embodiments pertain to the electronic cover, the electric lighting device, the method for manufacturing an electronic device, and use of the electronic cover. Synergetic effects may arise from different combinations of the embodiments although they might not be described in detail.

It shall be noted that all embodiments of the present invention concerning a method, might be carried out with the order of the steps as described, nevertheless this has not to be the only and essential order of the steps of the method. The herein presented methods can be carried out with another order of the disclosed steps without departing from the respective method embodiment, unless explicitly mentioned to the contrary hereinafter.

Technical terms are used by their common sense. If a specific meaning is conveyed to certain terms, definitions of terms will be given in the following in the context of which the terms are used.

According to a first aspect, an electronic cover is provided, wherein the electronic cover is a cover of an electrical lighting device, and the electronic cover comprises a conducting electrical track structure for lighting and control components.

In other words, the cover, which may be considered as a housing or closure of a lighting device or as a part it, is streaked with a conducting electrical track structure and therefore has tracks or traces inside similar to a PCB (printed circuit board), where "inside" means embedded into the material of the cover. That is, the expression "the cover comprises a conducting electrical track structure" does not mean that the cover covers a PCB that comprises electrical track structures, but the cover has integrated electrical conducting track structures. The conducting electrical track structure hence comprises tracks for conducting electric current such that the plastic cover works as PCB.

BRIEF DESCRIPTION OF THE SEVERAL VIEWS OF THE DRAWING(S)

DETAILED DESCRIPTION OF THE INVENTION

Figure 1:
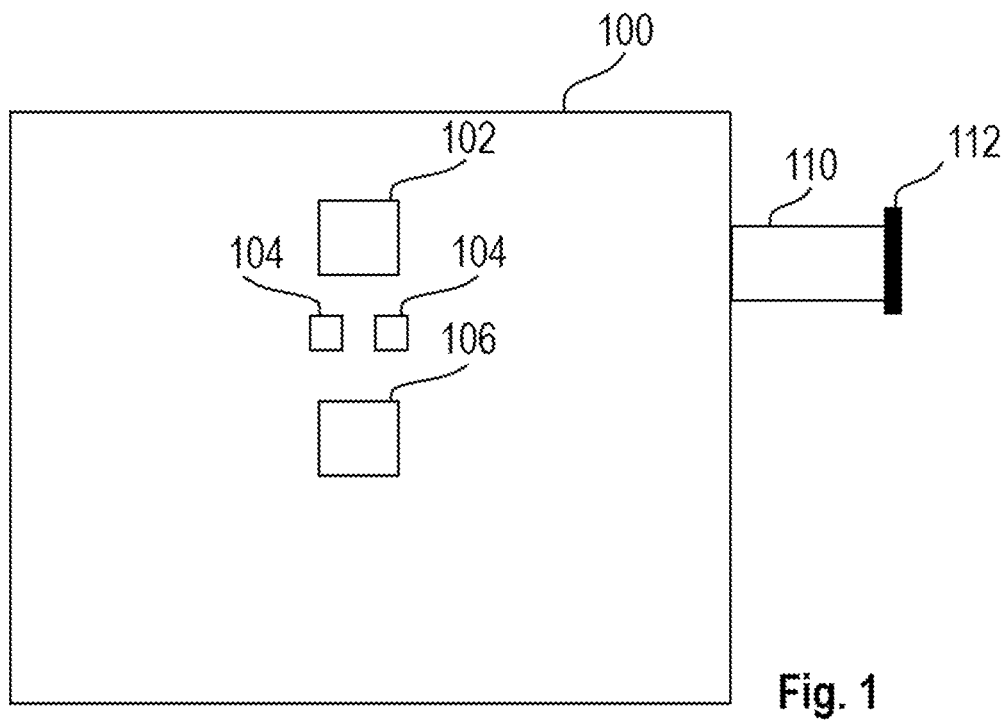
FIG. 1 is a diagram of an electronic cover according to an embodiment of the present disclosure.

FIG. 1 shows a diagram of an electronic cover 100 according to an embodiment. The electronic cover 100 comprises a touch button 102, two indicator LEDs, one lighting LED, a flexible cable 110 and a connector to the main PCB, or "PCBA".

The cover 100 is a free shape (3D) cover, which is printed using plastic material. Into the cover 100, a conducting track structure comprising tracks for supplying the LEDs with power and for receiving or sending control signals from/to the main PCBA is integrated. The conducting track structure is incorporated using flexible ink, which is also printed onto or into layers of the cover during the print process of the cover. The conducting track structure is not shown in FIG. 1. Therefore, the cover works as PCB. In addition, the buttons 102 and sliders such as slider 114 in FIG. 3 may be printed onto the cover, and LEDs 104, 106 may be glued onto the cover 100.

Figure 2A:
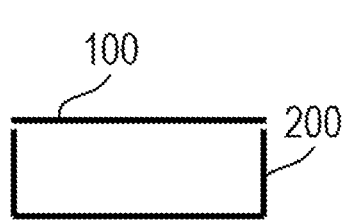
FIG. 2A is a diagram of a first shape of the electronic cover in accordance with the disclosure.

FIG. 2A shows diagram of a housing 200 and first shape of the electronic cover 100. The shape in this example is flat.

Figure 2B:
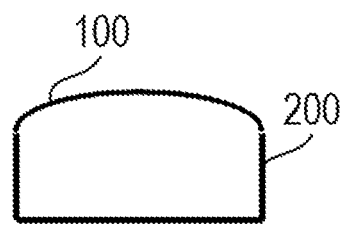
FIG. 2B is a diagram of a second shape of the electronic cover in accordance with the disclosure.

FIG. 2B shows diagram of a housing 200 and second shape of the electronic cover 100. The shape in this example is curved.

Figure 3:
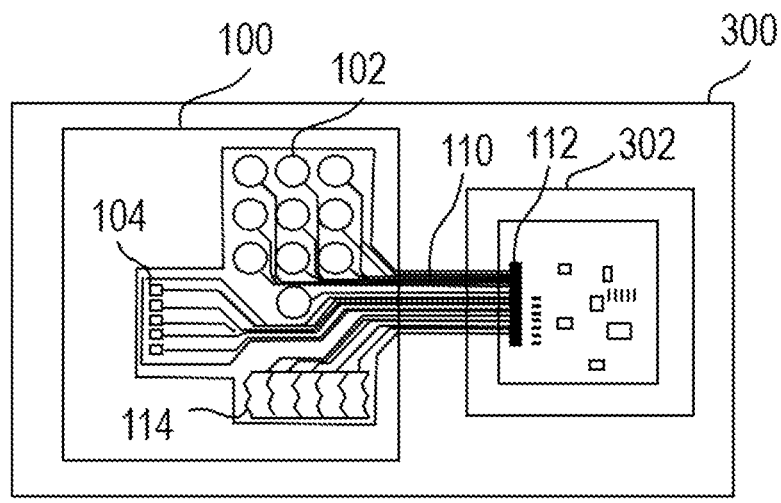
FIG. 3 is a diagram of a lighting device according to an embodiment of the present disclosure.

FIG. 3 shows diagram of a lighting device 300 according to an embodiment with an electronic cover 100 and a main PCB 302. The electronic cover 100 in this diagram comprises several buttons 102, LEDs 104 and a slider 114. Flexible cable 110 is connected to the main PCBA 302 with a connector 112. The PCB performs the input signal treatment coming the buttons 102 and slider 114. It comprises LED drivers, sensors, e.g. temperature or light sensors, power supply and analog and/or digital control circuits.

Figure 4:
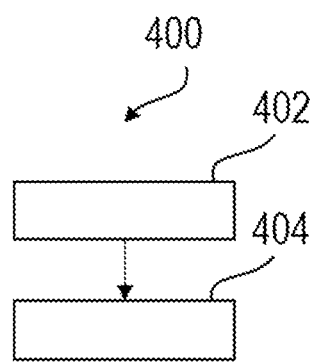
FIG. 4 shows a flow diagram of a method according to an embodiment of the present disclosure.

FIG. 4 shows a flow diagram of a method 400 according to an embodiment. The method 400 comprises the following steps.

Manufacturing 402 an electronic cover, wherein the electronic cover is a cover of an electrical lighting device and the electronic cover 100 comprises a conducting electrical track structure for lighting and control components, and manufacturing 404 the electric lighting device by assembling electronic cover with the electric lighting device.

Therefore, a solution is provided for improving the cover of a lighting device and the manufacturing process of the device. Traditional sub-assembly of such a lighting luminaire is replaced by a single part combining multiple functions. For this, a 3D PCB made of plastic is used. The electric tracks are printed on it with a conductive ink and the LEDs are directly glued on it. Buttons may also be embedded as capacitive pads. A connector may realize the connection to the main PCBA. The cover is provided to the final assembly line as a single component.

This invention saves assembly time, simplifies the supply chain and also decreases the failure rate caused by the multiple electrical connections between the different components. Moreover, it gives more freedom to the aesthetical design.

Other variations to the disclosed embodiments can be understood and effected by those skilled in the art in practicing the claimed invention, from the study of the drawings, the disclosure, and the appended claims. In the claims, the word "comprising" does not exclude other elements or steps and the indefinite article "a" or "an" does not exclude a plurality. A single processor or other unit may fulfill the functions of several items or steps recited in the claims. The mere fact that certain measures are recited in mutually different dependent claims does not indicate that a combination of these measures cannot be used to advantage. Any reference signs in the claims should not be construed as limiting the scope of the claims.

In the context of the present disclosure, an electrical lighting device is for example a device with lighting components that may further comprise status indicators, and display and control elements for user input or user control as described further below. Therefore, the cover can be manufactured such that it has already these electrical track structures when arriving from the supplier, and there is no need for assembling the cover with a separately manufactured PCB on or inside of it. The cover and the electrical track structure are therefore an integral piece.

According to an embodiment, the cover comprises lighting components mounted on or integrated into the electronic cover.

The lighting components are illuminants such as LEDs, lamps or other light sources. These components are integrated in or mounted on the electronic cover. "Integrated in" means, that at least a part of a lighting component is covered by the material of the cover.

The material may be a material that is translucent to at least a certain percentage. In this case, the lighting component may be fully covered by the material whereby several beneficial effects are achieved. For example, as a first effect, the lighting component is fixed without any further measures, and as a second effect, the emitted light disperses at the material such that a glare effect is avoided and a smooth illumination is achieved.

According to an embodiment, the cover is made of plastic.

The material of the cover may be plastic or any other suitable material, preferably synthetic material, which is non-conductive itself and which is printable. The conductive track structure then is incorporated into this material. Plastic has further the characteristic that is easily shapeable.

According to an embodiment, the conducting electrical track structure is realized by conductive ink.

Conductive ink is typically created by infusing graphite into ink, silver paste or other conductive materials. The conductive ink may be printed onto or into the electronic cover.

Preferably, the ink is flexible such that the material can be shaped or bent without breaking or loosing contact.

According to an embodiment, the cover comprises electronic devices.

The electronic devices may be electronic parts that are arranged in the material or on the cover and that are connected to the electronic conducting track structure. In principle, the electronic parts may be connected to the conducting track structure in a similar way as on PCB. Electronic parts that are to be arranged on the surface of the electric cover may be glued onto the cover. The components are connected to the conducting track structure directly by the printing and gluing process. Preferably, the electronic parts inside the cover are parts with low power losses, such that they do not heat-up the material and hence do not heat-up themselves.

According to an embodiment, the electronic devices are LEDs, display elements and/or operating elements.

Operating elements may be for example control elements such as switches, sliders and/or buttons. In other words, electronic devices that usually have to be mounted on a PCB and connected to the PCB by soldering, and which then have to be integrated into openings of the cover, are simply mounted or printed into or onto the cover and directly coupled to the conducting track structure. Buttons and/or sliders may be realized as capacitive buttons and/or sliders such that mechanical devices or any mechanics are avoided and the mounting is kept simple. No screws or rigid soldering on the PCB is required. Instead, the capacitive devices may simply be printed or glued on the cover.

The one or more buttons may be used for example to switch the electric lighting device on or off, to test the electrical lighting device, to switch in a different mode such that a part of the lighting components such as LEDs are switched on or off or a mode that automatically changes colors, etc. The sliders may be used for example for dimming the lighting components.

According to an embodiment, the electronic cover further comprises a connector to a PCB.

The connector may be for example a ZIF (Zero insertion force) type connector. However, any type of connector may be used to connect the cover to the PCB. In this disclosure, this PCB is also designated main PCB or PCBA for distinction from the PCB that is replaced by the presented cover. The connector may contain lines for power, control, signaling and/or data. Therefore, the main PCB may comprise a more complex track structure and electronics with components that may require cooling, In particular, the components are components not required in or on the cover, such as power transistors for driving the LEDs and microcontrollers with circuitry, etc. The main PCB for these components then can be manufactured separately in a usual way.

Furthermore, by connecting a such a main PCB, the device becomes modular. The cover may be changed without changing the main PCB, and vice versa.

According to an embodiment, a touch button is printed on the electronic cover.

The button may for example be a capacitive touch button. By printing the button on the electronic cover, no extra step for fastening the button is required and no mechanical effort is required for fastening or for changing and tapping a signal value.

According to an embodiment, the cover and the electrical track structure are a 3D print product.

By using the 3D print technology, it becomes possible to combine structural and aesthetical function, and "PCB" in one part. The realization of the PCB functionality, printing with conductive ink and thermoforming of a "PCB", i.e., the cover, may be obtained at once. The electronic cover can hence be manufactured as a single part and can be assembled together with the main PCB connected by for example the ZIF connector in the final assembly line, such that the manufacturing process of the lighting device is strongly simplified.

The shape of the electronic cover may be arbitrary. Whereas usual PCBs are plane, the electronic cover can accept any shape. If, for example, the shape is convex, the conducting track structure can be adapted to the convex shape. There is no requirement for adapting the form factor of a PCB to fit into the curved cover.

The shape may be obtained by the 3D print or in a separate step after creating the electronic cover already including the conductive track structure by thermoplastic methods.

According to a second aspect, an electric lighting device comprising an electronic cover as described herein is provided.

The electric lighting device may be preferably an emergency lighting device or a decorative lighting device. Depending on the thermal design with respect to embedded elements and current transitions between electronic parts and tracks of the conducting track structure, lighting applications with higher power may be realized.

According to an embodiment, the electric lighting device further comprises a PCB, wherein the PCB comprises support circuits for the electronic cover, and wherein the PCB is connected to the electronic cover by a connector.

"Connected by a connector" means that there is a cable to which suitable connectors or contacts are attached, such as a ZIF connector. Other types may be used and the types may be different for each of the cable ends.

The support circuits are for example LED drivers, sensors, input signal control circuits and/or power supply circuits. In this way, on one side, the electronic track structure can be kept simple, and on the other side, more complex circuits and heat dissipating devices can be realized and mounted by standard PCB. In this way, an economic, flexible and easy to manufacture solution is obtained.

According to a third aspect, a method for manufacturing an electric lighting device is provided. The method comprises the following steps.

As a first step, manufacturing an electronic cover, wherein the electronic cover is a cover of an electrical lighting device and the electronic cover comprises a conducting electrical track structure for lighting and control components, and as a second step, manufacturing the electric lighting device by assembling electronic cover with the electric lighting device.

The electric lighting device may comprise further components such as a main PCB with LED drivers, power supply, control logic, sensor, etc. A further step may therefore be producing the main PCB. This step may be performed before, after or contemporarily with the step of manufacturing the electronic cover.

The step of manufacturing an electronic cover may comprise the steps:

Printing in 3D the electronic cover with plastic material, printing the conducting electrical track structure, and printing control elements such as sliders and buttons. This step may comprise several sub-steps of printing the plastic material, the conducting electrical track structure, and the control elements that are carried out alternatingly as required. The step may further comprise integrating electrical parts, if such parts are foreseen.

Shaping the electronic cover. The shaping gives the cover the aesthetical look intended by the designer. The shaping may be achieved, for example by thermoplastic procedures such as supplying heat and forming using a mold.

Mounting the illuminants such as LEDs. The mounting may be accomplished for example by gluing. Thereby, the contacts of the LEDs are brought in direct contact with the lines of the conducting track structure.

The PCB and the electronic cover may comprise ports or contacts at which a cable may be connected. Therefore, the step of manufacturing the electric lighting device by assembling electronic cover with the electric lighting device may comprise the step of connecting the electronic cover and the PCB together with a cable. The cable may be for example a flexible ("flex") cable and the connector for the ports or contacts a corresponding connector such as a ZIF (Zero insertion force) type connector.

According to a fourth aspect, a use of an electronic cover described herein in an electric lighting device is provided.

More generally, a use of a 3D printed plastic part comprising a conductive track structure is provided, which is designed as a cover of a lighting device.

The features presented above and other features, aspects and advantages of the present invention will become better understood with reference to the accompanying figures and the following description. Identical or equivalent elements are in principle provided with the same reference signs.

LIST OF REFERENCE SIGNS 100 electronic cover
102 button(s)
104 LED(s), indicator LEDs
106 LED(s), illuminant LEDs
110 cable
112 connector
114 slider
200 housing
300 lighting device
302 PCB (main PCB; PCBA)
400 method
402 first step of method 400
404 second step of method 400

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An electronic cover, comprising:
   a body;
   a conducting electrical track structure embedded into the body, the conducting track structure configured to provide electrical connections to lighting and control components disposed on the body;
   wherein the electronic cover is a cover of an electrical lighting device, and
   wherein the electronic cover comprises a 3D printed control board (PCB) and the conducting track structure comprises 3D printed conductive ink layers.

2. The electronic cover according to claim 1, wherein the cover comprises lighting components mounted onto the body.

3. The electronic cover according to claim 1, wherein the cover comprises lighting components integrated into the body.

4. The electronic cover according to claim 1, wherein the cover is made of plastic.

5. The electronic cover according to claim 1, wherein the cover further comprises electronic devices attached to or at least partially embedded into the body.

6. The electronic cover according to claim 1, wherein the electronic devices are LEDs, display elements and/or operating elements.

7. The electronic cover according to claim 1, wherein the electronic cover further comprises a connector to a PCB.

8. The electronic cover according to claim 1, further comprising a touch button that is printed on to and embedded with the body.

9. An electric lighting device, comprising:
   a chassis that includes a printed control board (PCB);
   a cable connected to the PCB at one end;
   a plurality of electronic components electrically connected at another end of the cable using a conducting electrical track structure comprising 3D printed conductive ink layers; and
   a cover connected to the chassis;
   wherein the electronic components are disposed on or at least partially embedded with the cover.

10. The electric lighting device according to claim 9, wherein the PCB comprises support circuits for the electronic cover; and
    wherein the PCB is connected to the cable by a connector.

11. A method for manufacturing an electric lighting device, comprising:
    manufacturing an electronic cover, wherein the electronic cover is a cover of an electrical lighting device, and wherein the electronic cover comprises a conducting electrical track structure comprising 3D printed conductive ink layers for lighting and control components; and
    manufacturing the electric lighting device by assembling the electronic cover with the electric lighting device.

12. The method of claim 11, wherein manufacturing the electric cover further comprises:
    3D printing the electronic cover; and
    before assembling the electronic cover with the electric lighting device, 3D printing the conducting track structure onto the electronic cover using flexible conductive ink.

* * * * *